United States Patent [19]

Kawata et al.

[11] Patent Number: 5,912,102
[45] Date of Patent: Jun. 15, 1999

[54] POSITIVE RESIST COMPOSITION

[75] Inventors: Shoji Kawata; Motofumi Kashiwagi; Teturyo Kusunoki; Masahiro Nakamura, all of Kanagawa, Japan

[73] Assignee: Nippon Zeon Co., Ltd., Tokyo, Japan

[21] Appl. No.: 08/860,365

[22] PCT Filed: Dec. 28, 1994

[86] PCT No.: PCT/JP94/02301

§ 371 Date: Jun. 26, 1997

§ 102(e) Date: Jun. 26, 1997

[87] PCT Pub. No.: WO96/20430

PCT Pub. Date: Jul. 4, 1996

[51] Int. Cl.$^6$ .................................................. G03F 7/023
[52] U.S. Cl. ........................ 430/191; 430/165; 430/192; 430/193
[58] Field of Search .................................. 430/191, 192, 430/193, 165

[56] References Cited

U.S. PATENT DOCUMENTS

| | | | |
|---|---|---|---|
| 4,377,631 | 3/1983 | Toukhy et al. | 430/192 |
| 5,112,719 | 5/1992 | Yamada et al. | 430/191 |
| 5,407,779 | 4/1995 | Uetani et al. | 430/191 |
| 5,547,814 | 8/1996 | Blakeney et al. | 430/192 |
| 5,609,982 | 3/1997 | Sato et al. | 430/192 |
| 5,629,128 | 5/1997 | Shirakawa et al. | 430/191 |
| 5,700,620 | 12/1997 | Sakaguchi et al. | 430/192 |

FOREIGN PATENT DOCUMENTS

| | | |
|---|---|---|
| 0445819 | 9/1991 | European Pat. Off. . |
| 0496640 | 7/1992 | European Pat. Off. . |
| 0598320 | 5/1994 | European Pat. Off. . |
| 0658807 | 6/1995 | European Pat. Off. . |
| 58-17112 | 2/1983 | Japan . |
| 63-184745 | 7/1988 | Japan . |
| 2-296248 | 12/1990 | Japan . |
| 2-296249 | 12/1990 | Japan . |
| 3-48249 | 3/1991 | Japan . |
| 3-200251 | 9/1991 | Japan . |
| 3-200252 | 9/1991 | Japan . |
| 3-200253 | 9/1991 | Japan . |
| 3-259149 | 11/1991 | Japan . |
| 3-296757 | 12/1991 | Japan . |
| 5-27446 | 2/1993 | Japan . |

OTHER PUBLICATIONS

International Search Report for PCT/JP94/02301.
EPO Communication, for Application No. 95904030.4, including Supplementary European Search Report (Mar. 17, 1998).

*Primary Examiner*—John S. Chu
*Attorney, Agent, or Firm*—Dinsmore & Shohl LLP

[57] ABSTRACT

A positive resist composition comprising an alkali-soluble phenolic resin, a photosensitive agent composed of a quinonediazide sulfonate of a specific polyhydroxy compound, and an aromatic compound having at least one phenolic hydroxyl group.

14 Claims, No Drawings

POSITIVE RESIST COMPOSITION

DESCRIPTION

1. Technical Field

The present invention relates to a positive resist composition, and more particularly to a positive resist composition suitable for use in minute processing required for the fabrication of semiconductor devices, magnetic bubble memory devices, integrated circuits and the like.

2. Background Art

In order to form a minute pattern using a resist, a solution containing a photosensitive material (a resist composition) is applied to a substrate and dried to form a photosensitive film, and the film is then exposed to active rays to form a latent image. The latent image is then developed to form a negative or positive image. Upon fabrication of a semiconductor device by minute processing making use of a resist, in general, a silicon wafer is used as a substrate to form an image (pattern) thereon by the above-described lithography technique. After etching the silicon wafer by using, as a protective film, the resist remaining on the substrate, the remaining resist film is removed. According to a positive resist, the solubility of an exposed part of a photosensitive film formed from the resist in a developer increases compared with that of an unexposed part to give a positive image. According to a negative resist on the other hand, the solubility of an exposed part of a photosensitive film formed from it decreases to give a negative image.

For example, a negative resist composed of cyclized polyisoprene and a bisdiazide compound has heretofore been known as a resist composition for the fabrication of semiconductor devices. However, this negative resist involves a drawback that it cannot be accommodated to the fabrication of semiconductors integrated to a high degree because the resist is developed with an organic solvent, so that it swells to a significant extent and there is hence a limit to its resolution. Besides, a negative resist comprising poly (glycidyl methacrylate) has high sensitivity, but is poor in resolution and resistance to dry etching.

On the other hand, positive resist compositions are believed that they can be satisfactorily accommodated to the integration of semiconductors to a high degree because they are excellent in resolution in contrast with the negative resist compositions. Positive resist compositions composed of an alkali-soluble resin such as a novolak resin, and a quinonediazide compound are in common use in this field at present. These positive resist compositions can be developed with an aqueous solution of an alkali and have excellent resolution. Further, the resolution of such a positive resist composition has been enhanced by improvement in its own performance and the development of a higher-performance aligner, so that formation of a minute pattern having a line width of 1 μm or smaller has come to be feasible.

With respect to various properties such as sensitivity, film loss after development, resolution, thermal-flow resistance and storage stability, however, satisfactory results are not necessarily obtained from the conventional positive resist compositions. It is thus desired that the performance of the positive resist compositions be further enhanced.

In the formation of a minute pattern having a line width of 1 μm or smaller, particularly 0.8 μm or smaller, it is necessary to more strictly control dimensions of a resist pattern. There is accordingly a strong demand for development of a positive resist composition having higher dimensional accuracy.

It has recently been proposed to use, as a photosensitive agent, a quinonediazide sulfonate of each of various phenolic compounds (for example, Japanese Patent Application Laid-Open Nos. 296248/1990 and 296249/1990). However, the positive resist compositions specifically disclosed in these documents are somewhat insufficient in sensitivity, resolution, film loss after development, exposure margin or pattern profile. There is thus a demand for development of a further improved positive resist composition.

DISCLOSURE OF THE INVENTION

It is an object of the present invention to provide a positive resist composition excellent in balance among various properties such as sensitivity, film loss after development, resolution, exposure margin and pattern profile and suitable for use in minute processing to 1 μm or smaller in line width.

The present inventors have carried out an extensive investigation with a view toward overcoming the above-described problems involved in the prior art. As a result, it has been found that the above object can be achieved by using a photosensitive material comprising in combination (a) an alkali-soluble phenol resin, (b) a quinonediazide sulfonate of a specific polyhydroxy compound as a photosensitive agent and (c) an aromatic compound having at least one phenolic hydroxyl group.

The photosensitive material according to the present invention, i.e., a positive resist composition, is excellent in balance among various properties such as sensitivity, film loss after development, resolution and pattern profile and is also good in exposure margin, thermal-flow resistance, storage stability and resistance to dry etching. The present invention has been led to completion on the basis of these findings.

According to the present invention, there is thus provided to a positive resist composition comprising in combination (a) an alkali-soluble phenol resin, (b) a photosensitive agent composed of a quinonediazide sulfonate of a polyhydroxy compound represented by the following general formula (I), and (c) an aromatic compound having at least one phenolic hydroxyl group:

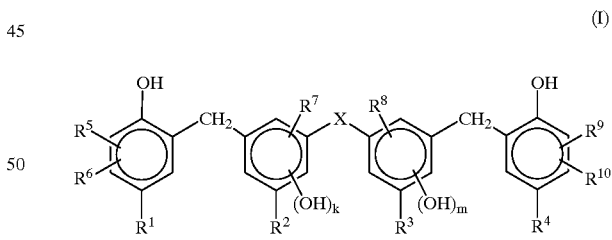

(I)

wherein
k is 1 or 2;
m is 1 or 2:
$R^1$ to $R^4$ are independently a halogen atom, or an alkyl, alkenyl, alkoxy, aryl or acyl group and may be the same or different from one another;
$R^5$ to $R^{10}$ are independently a hydrogen or halogen atom, or an alkyl, alkenyl, alkoxy, aryl or acyl group and may be the same or different from one another; and
X is a single bond, or a linking group composed of —O—, —S—, —SO—, —SO$_2$—, —CO—, —CO$_2$—, cyclopentylidene, cyclohexylidene, phenylene,

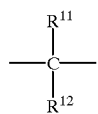

($R^{11}$ and $R^{12}$ being independently a hydrogen atom, or an alkyl, alkenyl, aryl or substituted aryl group and may being the same or different from each other),

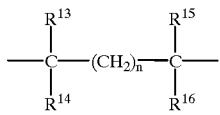

($R^{13}$ to $R^{16}$ being independently a hydrogen atom or an alkyl group and may being the same or different from one another, and n being an integer of 1–5), or

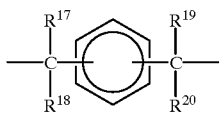

($R^{17}$ to $R^{20}$ being independently a hydrogen atom or an alkyl group and may being the same or different from one another).

BEST MODE FOR CARRYING OUT THE INVENTION

The present invention will hereinafter be described in detail.

(a) Alkali-soluble phenol resin:

Examples of the alkali-soluble phenol resin useful in the practice of the present invention include condensation products of a phenol and an aldehyde, condensation products of a phenol and a ketone, vinylphenol polymers, isopropenylphenol polymers, and hydrogenation products of these phenol resins.

Specific examples of the phenol used herein include monohydric phenols such as phenol, cresol, xylenol, ethylphenol, propylphenol, butylphenol and phenylphenol, and polyhydric phenols such as resorcinol, pyrocatechol, hydroquione, bisphenol A, phloroglucinol and pyrogallol. Preferable examples of the phenols include cresol and xylenol, with m-cresol, p-cresol and 3,5-xylenol being particularly preferred. These phenols may be used either singly or in any combination thereof. A combination of m-cresol and p-cresol and a combination of m-cresol, p-cresol and 3,5-xylenol are preferable examples.

Specific examples of the aldehyde include formaldehyde, acetoaldehyde, benzaldehyde and terephthalaldehyde. Specific examples of the ketone include acetone, methyl ethyl ketone, diethyl ketone and diphenyl ketone. The condensation reactions of their corresponding compounds mentioned above can be performed in accordance with a method known per se in the art.

The vinylphenol polymer is selected from among a homopolymer of vinylphenol and copolymers of vinylphenol and a component copolymerizable therewith. Specific examples of the copolymerizable component include acrylic acid, methacrylic acid, styrene, maleic anhydride, maleinimide, vinyl acetate, acrylonitrile and derivatives thereof.

The isopropenylphenol polymer is selected from among a homopolymer of isopropenylphenol and copolymers of isopropenylphenol and a component copolymerizable therewith. Specific examples of the copolymerizable component include acrylic acid, methacrylic acid, styrene, maleic anhydride, maleinimide, vinyl acetate, acrylonitrile and derivatives thereof.

When a hydrogenation product of a phenol resin is used herein, it can be prepared by any optional known method. For example, the hydrogenated product can be obtained by dissolving the phenol resin in an organic solvent and then introducing hydrogen into the solution in the presence of a homogeneous or heterogeneous hydrogenation catalyst.

These alkali-soluble phenol resins may be used either singly or in any combination thereof. The alkali-soluble phenol resin may be used as it is, but may be fractionated by a known means to control its molecular weight and molecular weight distribution before use. Methods of fractionating the phenol resin with a view toward controlling its molecular weight and molecular weight distribution include a method in which the resin is ground and subjected to solid-liquid extraction with an organic solvent having a suitable solubility, and a method the resin is dissolved in a good solvent, and the solution is added dropwise to a poor solvent, or the poor solvent is added dropwise to the solution, thereby conducting solid-liquid extraction or liquid-liquid extraction.

(b) Photosensitive agent:

No particular limitation is imposed on the photosensitive agent useful in the practice of the present invention so far as it is the quinonediazide sulfonate of the polyhydroxy compound represented by the general formula (I).

Examples of the quinonediazide sulfonate include the 1,2-benzoquinonediazide-4-sulfonate, 1,2-naphthoquinonediazide-4-sulfonate, 1,2-naphthoquinonediazide-5-sulfonate, 2,1-naphthoquinonediazide-4-sulfonate, 2,1-naphthoquinonediazide-5-sulfonates and esters of other quinonediazide sulfonic acid derivatives.

The photosensitive agent useful in the practice of the present invention can be synthesized by the esterification reaction of the phenolic compound of the general formula (I) with a quinonediazide sulfonic compound. Examples of the quinonediazide sulfonic compound include o-quinonediazide sulfonic compounds such as 1,2-benzoquinonediazide-4-sulfonic acid, 1,2-naphthoquinonediazide-4-sulfonic acid, 1,2-naphthoquinonediazide-5-sulfonic acid, 2,1-naphthoquinonediazide-4-sulfonic acid and 2,1-naphthoquinonediazide-5-sulfonic acid, and other quinonediazide sulfonic acid derivatives.

The quinonediazide sulfonate useful in the practice of the present invention is obtained by reacting the quinonediazide sulfonic compound with chlorosulfonic acid in accordance with a method known per se in the art to form a sulfonyl chloride and subjecting the thus-obtained quinonediazide sulfonyl chloride and the polyhydroxy compound represented by the general formula (I) to a esterification reaction. The quinonediazide sulfonate can be prepared, for example, by dissolving predetermined amounts of the polyhydroxy compound and 1,2-naphthoquinonediazide-5-sulfonyl chloride in a solvent such as dioxane, acetone or tetrahydrofuran, adding a basic catalyst such as triethylamine, pyridine, sodium carbonate, sodium hydrogencarbonate, sodium hydroxide or potassium hydroxide to the solution to conduct the reaction, washing the resultant product with water and drying it.

The polyhydroxy compound serving as a back bone of the photosensitive agent used in the present invention is a compound represented by the general formula (I).

In the general formula (I), chlorine and bromine are preferred as the halogen atoms. Alkyl groups having 1–4 carbon atoms are preferred as the alkyl groups. Alkenyl groups having 2–5 carbon atoms are preferred as the alkenyl groups. Alkoxy groups having 1–6 carbon atoms are preferred as the alkoxy groups. Aryl groups having 6–15 carbon atoms are preferred as the aryl groups. Aryl groups substituted by an alkyl group having 1–4 carbon atoms or a halogen atom are preferred as the substituted aryl groups.

Preferred polyhydroxy compounds represented by the general formula (I) include compounds represented by the following general formula (II):

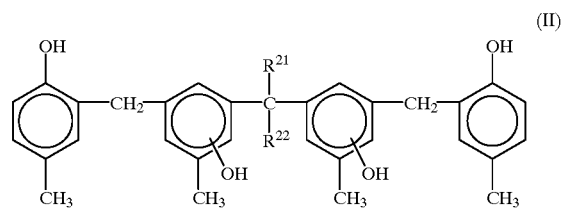

(II)

wherein $R^{21}$ and $R^{22}$ are independently a hydrogen atom or an alkyl group and may be the same or different from each other. As described above, the alkyl groups are preferably alkyl groups having 1–4 carbon atoms.

As specific examples of the polyhydroxy compound serving as a back bone of the photosensitive agent used in the present invention and represented by the general formula (I), may be mentioned the following Compounds (b-1) to (b-34):

(b-1)

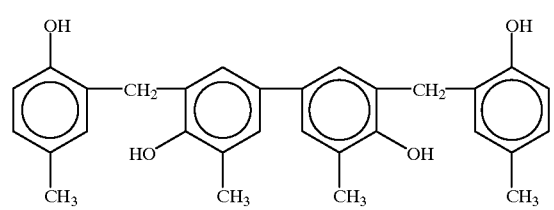

(b-2)

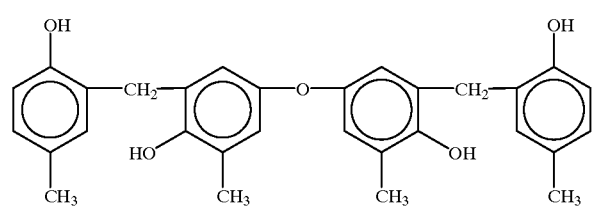

(b-3)

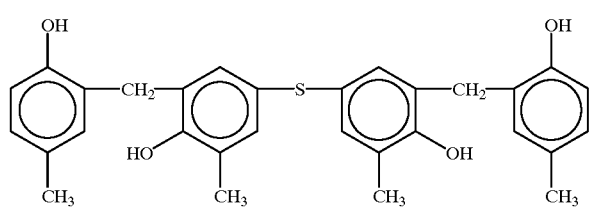

(b-4)

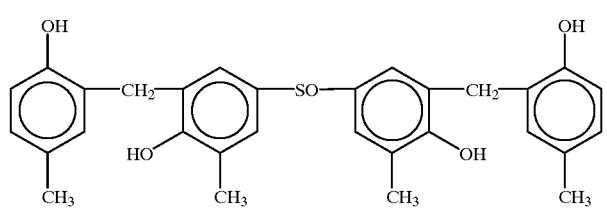

(b-5)

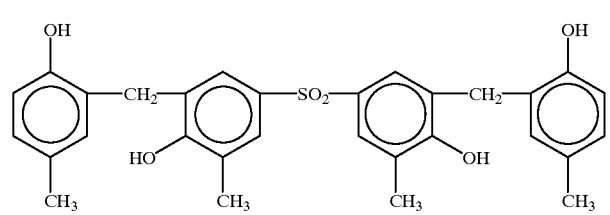

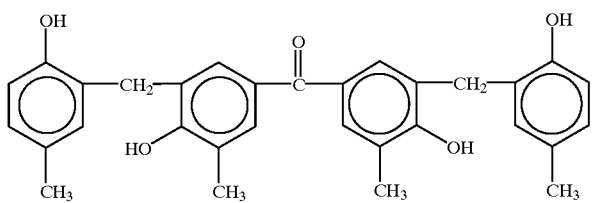
(b-6)
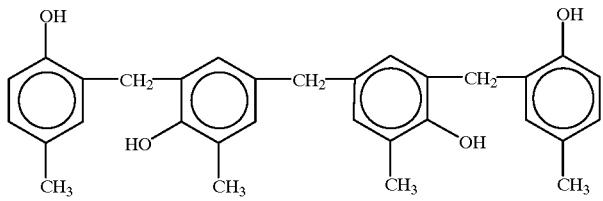
(b-7)
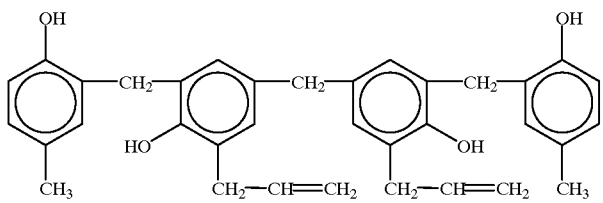
(b-8)
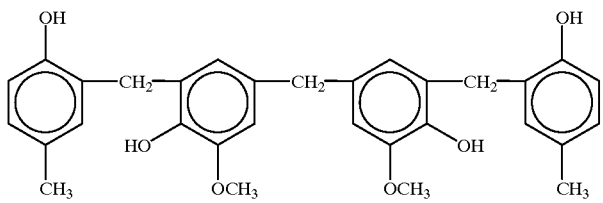
(b-9)
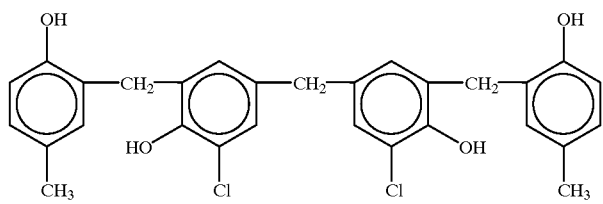
(b-10)
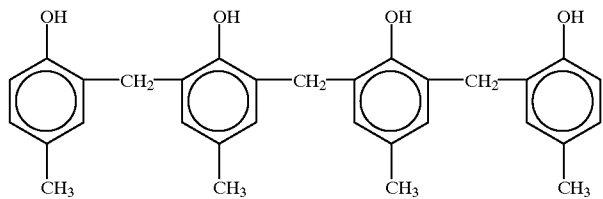
(b-11)

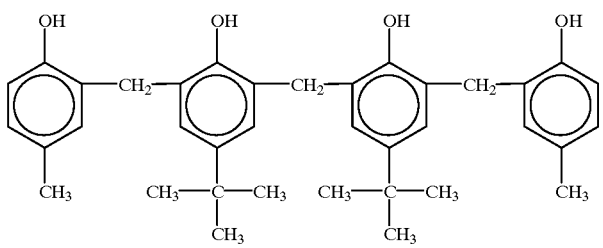
(b-12)
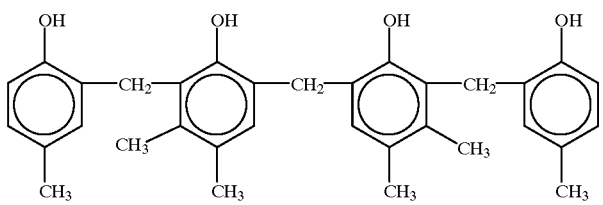
(b-13)
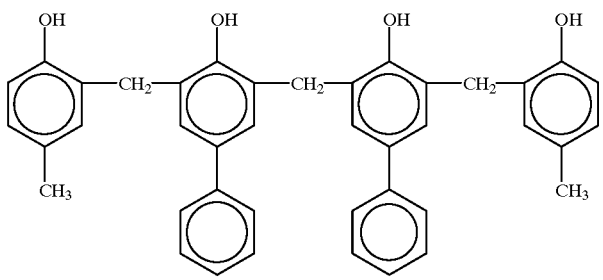
(b-14)
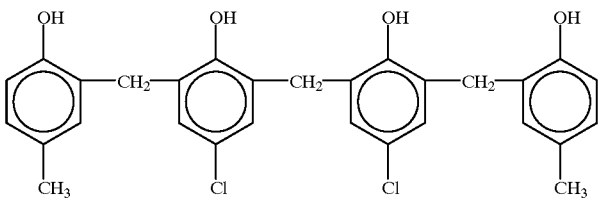
(b-15)
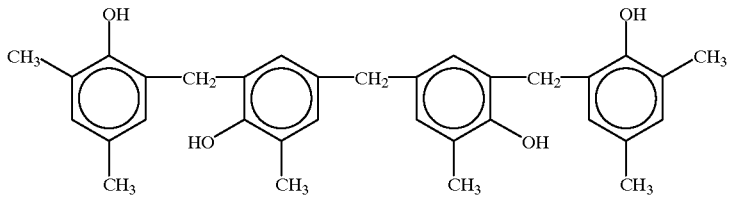
(b-16)
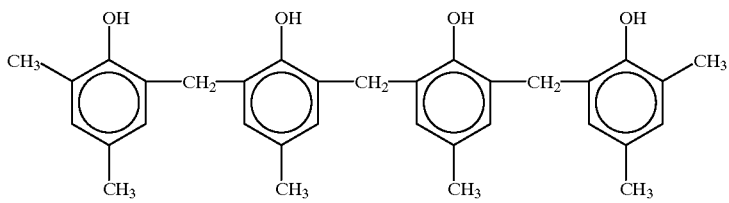
(b-17)

(b-18)
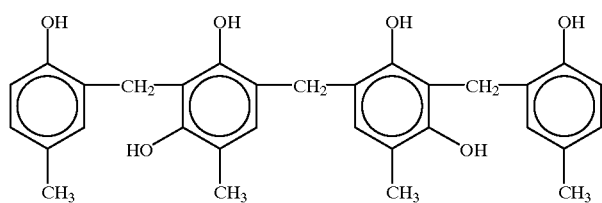
(b-19)
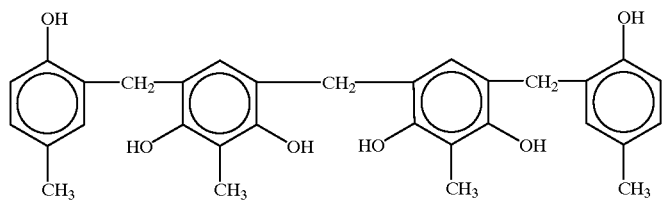
(b-20)
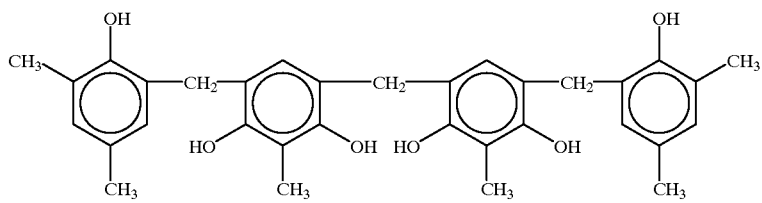
(b-21)
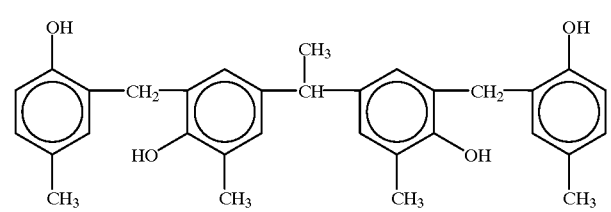
(b-22)
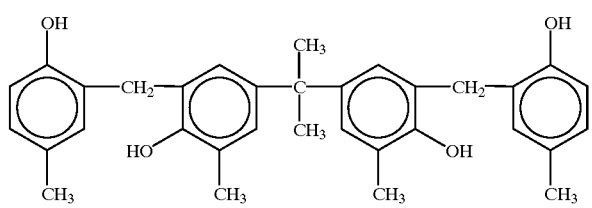
(b-23)
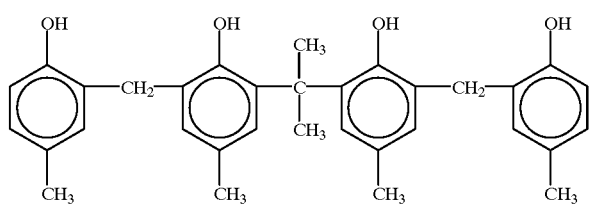

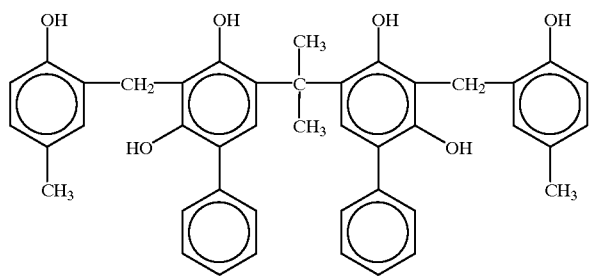
(b-24)
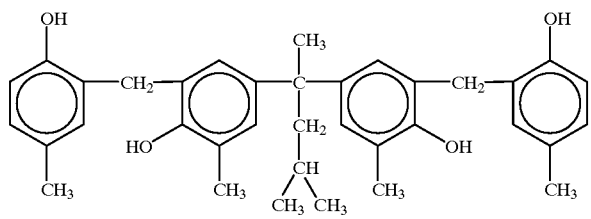
(b-25)
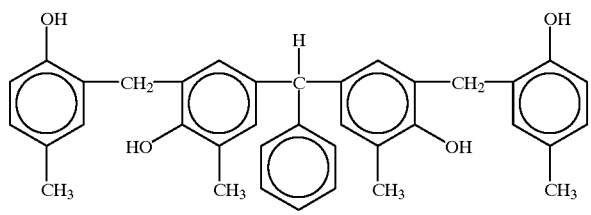
(b-26)
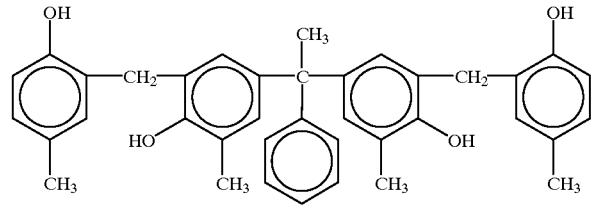
(b-27)
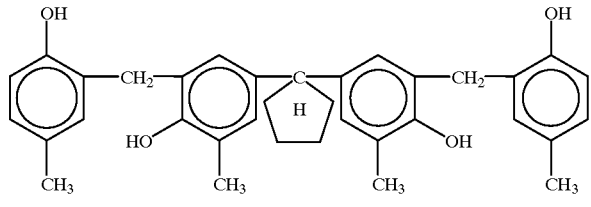
(b-28)
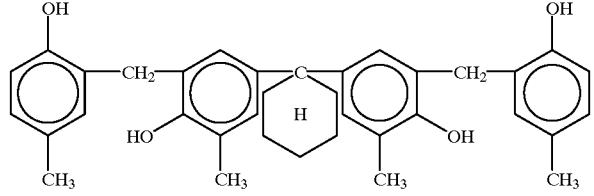
(b-29)

-continued

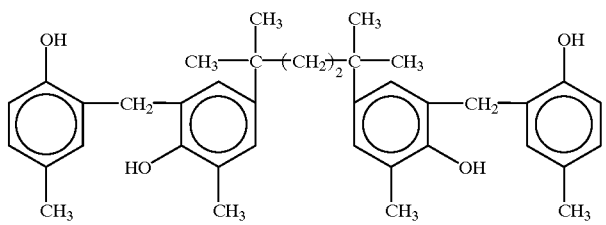
(b-30)

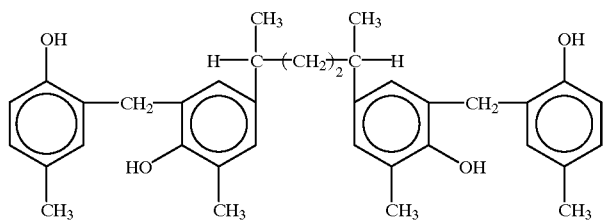
(b-31)

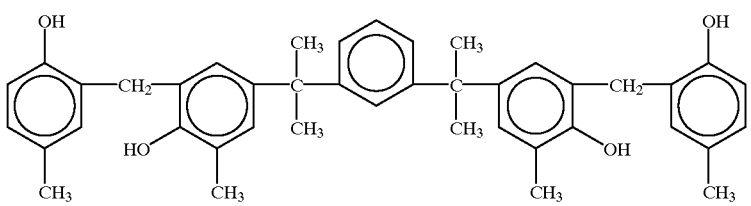
(b-32)

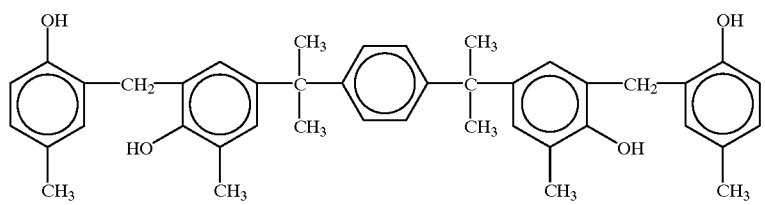
(b-33)

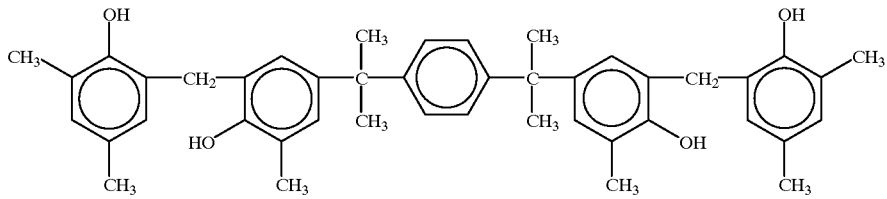
(b-34)

In the photosensitive agent useful in the practice of the present invention, no particular limitation is imposed on the esterification degree (average esterification degree) of the quinonediazide sulfonic compound to the polyhydroxy compound represented by the general formula (I), but it generally falls within a range of 20–100%, preferably 40–95%, more preferably 65–90% (as expressed in terms of mol % of the quinonediazide sulfonic compound to the OH groups) of the OH groups of the polyhydroxy compound. Any esterification degree too low may possibly bring about the deterioration in pattern profile and resolution. On the other hand, any esterification degrees too high may possibly bring about the deterioration of sensitivity.

No particular limitation is imposed on the concentration of the photosensitive agent used in the present invention to be incorporated. However, the concentration is generally 1–100 parts by weight, preferably 3–50 parts by weight, more preferably 10–40 parts by weight per 100 parts by weight of the alkali-soluble phenol resin. Any concentration too low will make it impossible to form any pattern having a sufficient film loss after development and bring about the deterioration of resolution. On the other hand, any concentration too high will bring about the deterioration of thermal-flow resistance. It is hence not preferable to use the photosensitive agent in any amount outside the above range.

The photosensitive agents useful in the practice of the present invention may be used either singly or in any combination thereof. The photosensitive agents may also be used in combination with a small amount (generally, at most 30 wt. % based on the total weight of the photosensitive agents) of at least one photosensitive agent of a different kind within limits not impeding the object of the present invention. No particular limitation is imposed on the combining photosensitive agent so far as it is a known quinonediazide sulfonate.

(c) Aromatic compound having at least one phenolic hydroxyl group:

In the positive resist composition according to the present invention, an aromatic compound having at least one phenolic hydroxyl group (hereinafter may called "the phenolic compound" merely) is incorporated. By incorporating the phenolic compound, the alkali-solubility of the alkali-soluble phenol resin is facilitated, so that the performance of the resulting positive resist composition, for example, the sensitivity, film loss after development, resolution and thermal-flow resistance, can be enhanced.

No particular limitation is imposed on the phenolic compound useful in the practice of the present invention. However, aromatic compounds represented by the following general formula (III) and/or general formula (IV) are preferred.

(III)

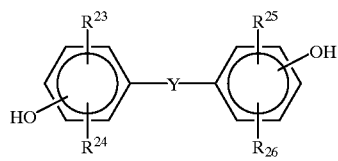

wherein
$R^{23}$ to $R^{26}$ are independently a hydrogen or halogen atom, or a hydroxyl, alkyl, alkenyl, aryl or alkoxy group and may be the same or different from one another; and Y is a single bond, or a linking group composed of —O—, —S—, —SO—, —SO$_2$—, —CO—, —CO$_2$—, cyclopentylidene, cyclohexylidene, phenylene,

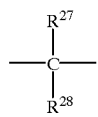

($R^{27}$ and $R^{28}$ being independently a hydrogen atom, or an alkyl, alkenyl, aryl or substituted aryl group and may being the same or different from each other),

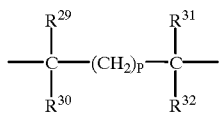

($R^{29}$ to $R^{32}$ being independently a hydrogen atom or an alkyl group and may being the same or different from one another, and p being an integer of 1–5),

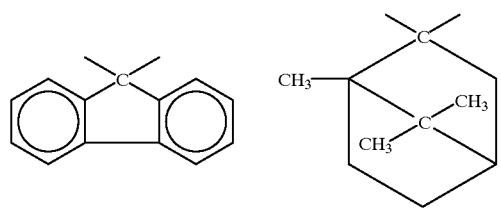

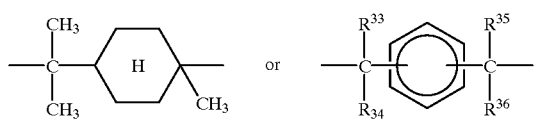

($R^{33}$ to $R^{36}$ being independently a hydrogen atom or an alkyl group and may being the same or different from one another).

(IV)

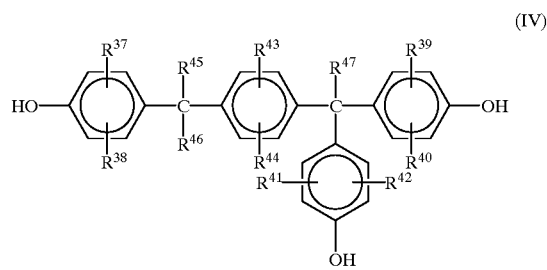

wherein
$R^{37}$ to $R^{42}$ are independently a hydrogen or halogen atom, or a hydroxyl, alkyl, alkenyl, aryl or alkoxy group and may be the same or different from each other;

$R^{43}$ and $R^{44}$ are independently a hydrogen or halogen atom, or an alkyl group and may be the same or different from each other; and $R^{45}$ to $R^{47}$ are independently a hydrogen atom or an alkyl group and may be the same or different from one another.

In the general formulae (III) and (IV), chlorine and bromine are preferred as the halogen atoms. Alkyl groups having 1–4 carbon atoms are preferred as the alkyl groups. Alkenyl groups having 2–5 carbon atoms are preferred as the alkenyl groups. Alkoxy groups having 1–6 carbon atoms are preferred as the alkoxy groups. Aryl groups having 6–15 carbon atoms are preferred as the aryl groups. Aryl groups substituted by an alkyl group having 1–4 carbon atoms or a halogen atom are preferred as the substituted aryl groups.

As specific examples of the aromatic compounds represented by the general formula (III), may be mentioned the following Compounds (c-1) to (c-62):

(C-1)

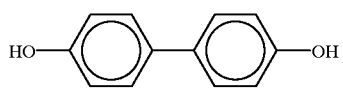

(C-2)

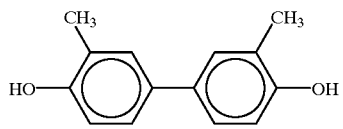

(C-3)

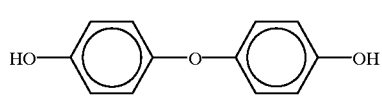

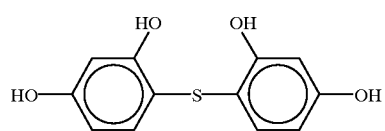 (C-4)
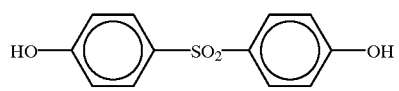 (C-5)
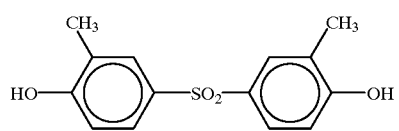 (C-6)
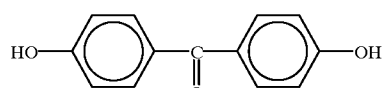 (C-7)
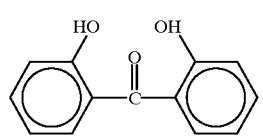 (C-8)
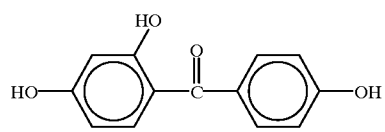 (C-9)
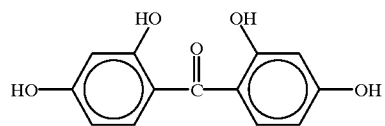 (C-10)
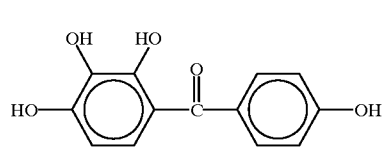 (C-11)
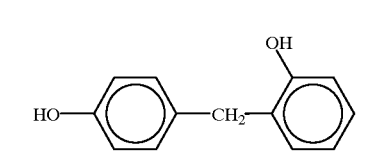 (C-12)
 (C-13)
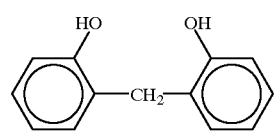 (C-14)
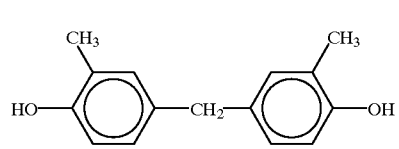 (C-15)
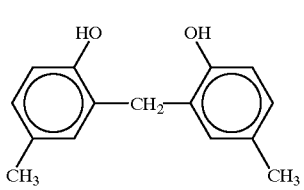 (C-16)
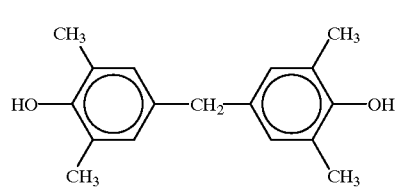 (C-17)
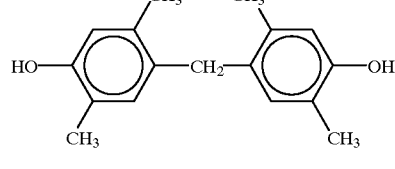 (C-18)
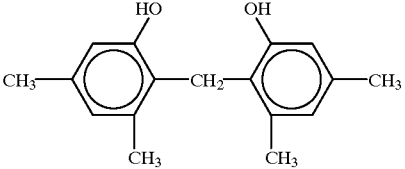 (C-19)
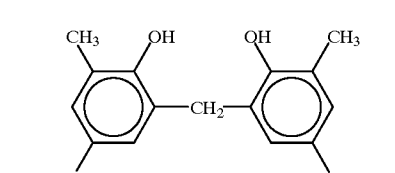 (C-20)
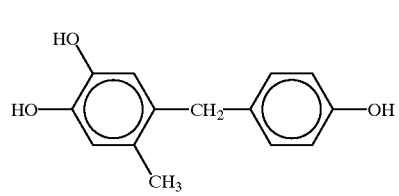 (C-21)

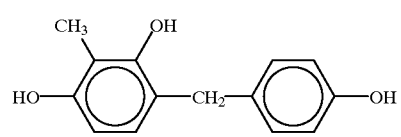(C-22)
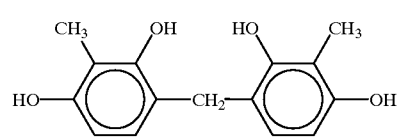(C-23)
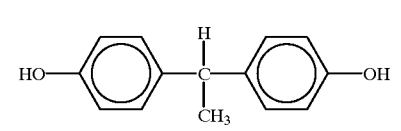(C-24)
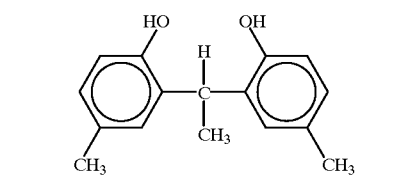(C-25)
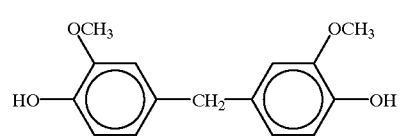(C-26)
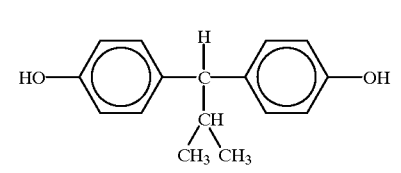(C-27)
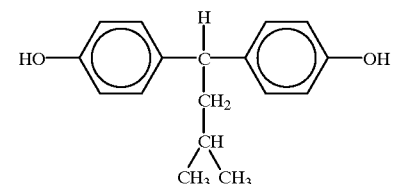(C-28)
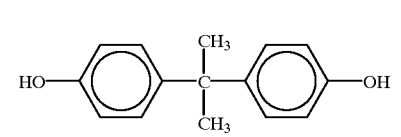(C-29)
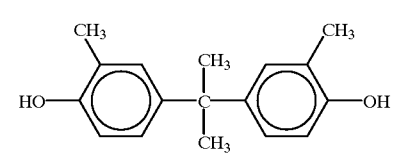(C-30)
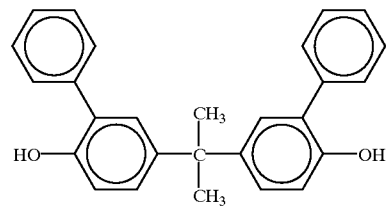(C-31)
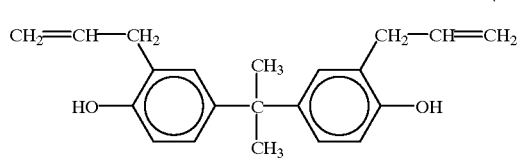(C-32)
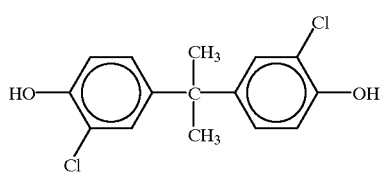(C-33)
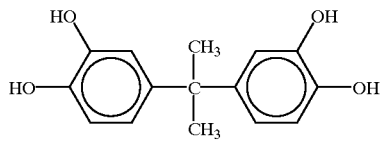(C-34)
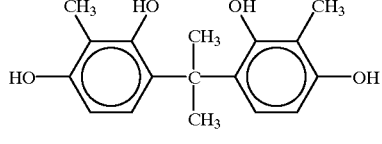(C-35)
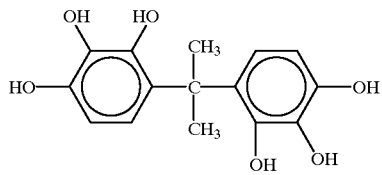(C-36)
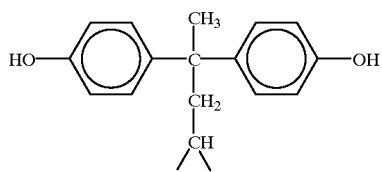(C-37)
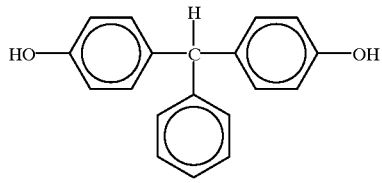(C-38)

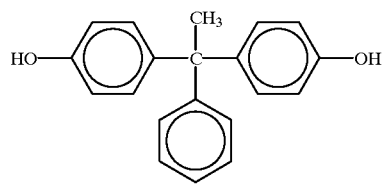
(C-39)
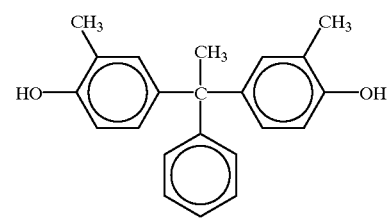
(C-40)
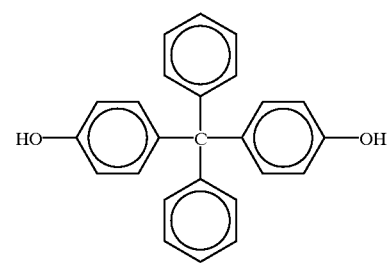
(C-41)
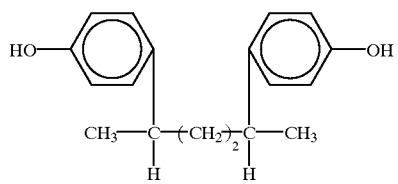
(C-42)
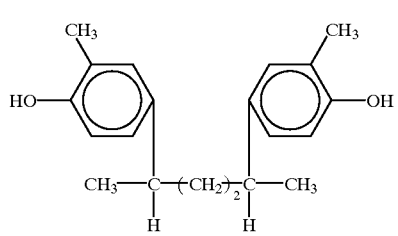
(C-43)
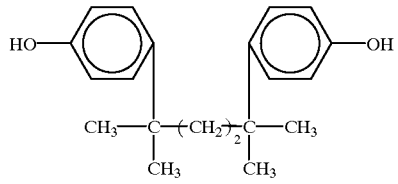
(C-44)
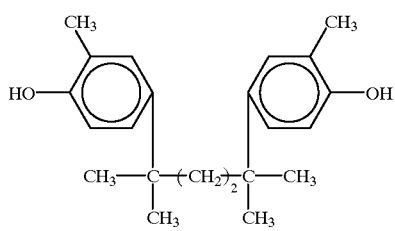
(C-45)
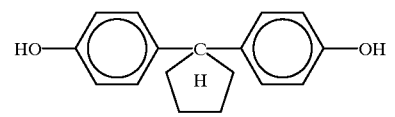
(C-46)
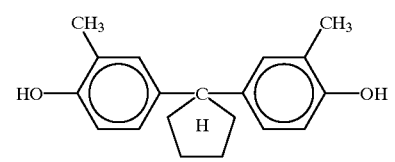
(C-47)
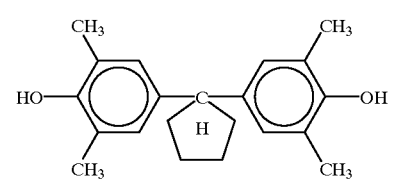
(C-48)
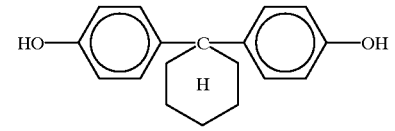
(C-49)
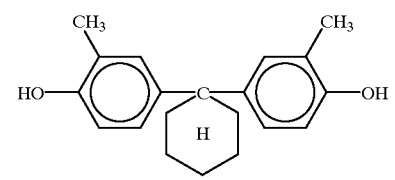
(C-50)
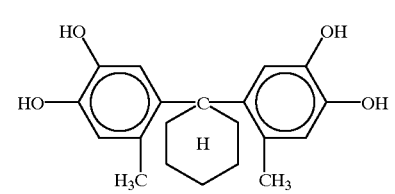
(C-51)
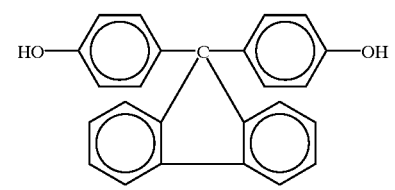
(C-52)

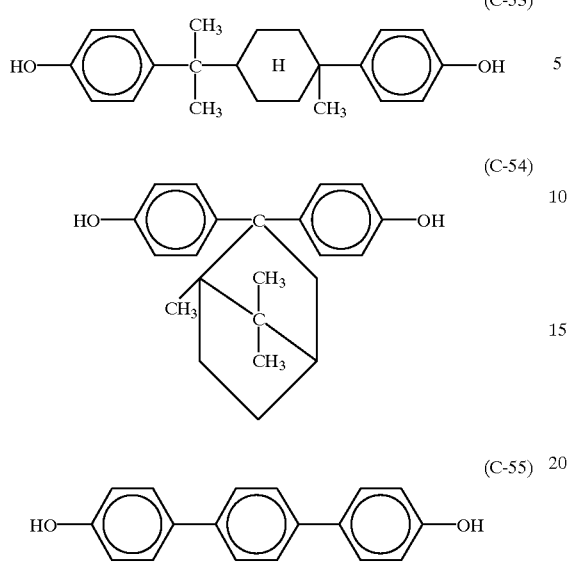
(C-53)
(C-54)
(C-55)
(C-56)
(C-57)
(C-58)
(C-59)
(C-60)
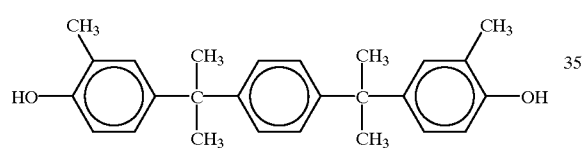
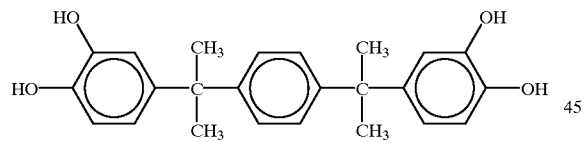
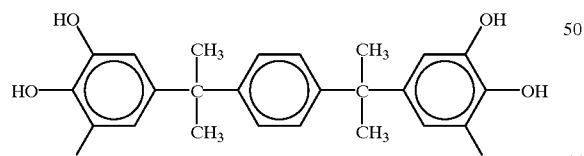
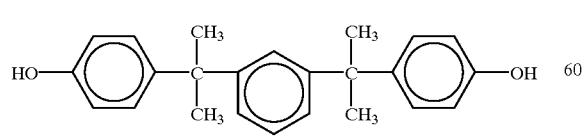
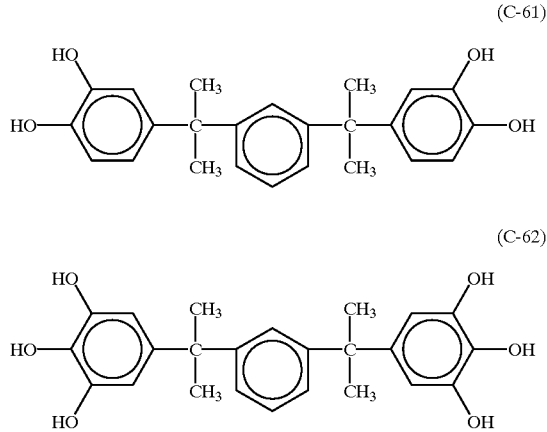
(C-61)
(C-62)
As specific examples of the aromatic compounds represented by the general formula (IV), may be mentioned the following Compounds (c-63) to (c-66):
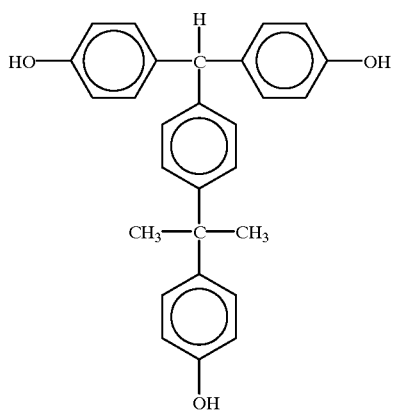
(C-63)
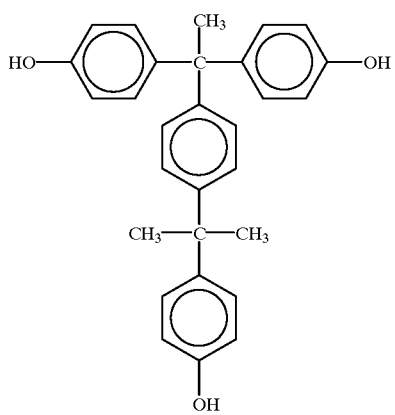
(C-64)

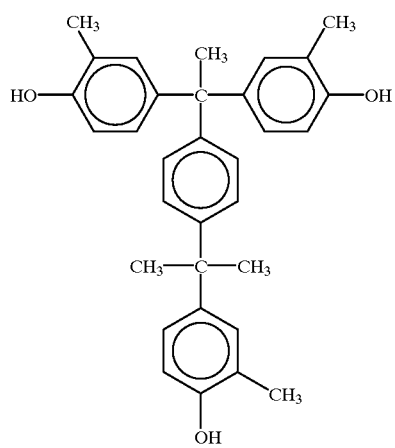
(C-65)

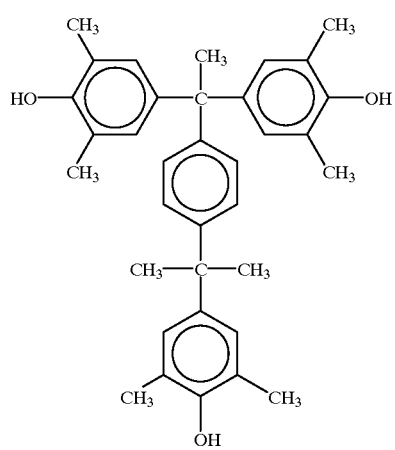
(C-66)

Among these phenolic compounds, Compounds c-1, c-12, c-13, c-14, c-49, c-52, c-56, c-60 and c-64 are particularly preferred.

The concentration of these phenolic compounds to be incorporated is generally 1–100 parts by weight per 100 parts by weight of the alkali-soluble phenol resin. The preferable concentration of the phenolic compounds to be incorporated varies according to the composition, molecular weight and molecular weight distribution of the alkali-soluble phenol resin to be used, or the kind and concentration of the photosensitive agent to be incorporated, but is generally 3–60 parts by weight. These phenolic compounds may be used either singly or in any combination thereof.

Solvent:

The positive resist composition according to the present invention is generally used in a state that it is dissolved in a solvent, in order to coat a substrate with the solution to form a resist film.

Examples of the solvent include ketones such as acetone, methyl ethyl ketone, cyclohexanone, cyclopentanone and 2-heptanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate and ethyl butyrate; monohydroxycarboxylic acid esters such as methyl 2-hydroxypropionate, ethyl 2-hydroxypropionate, methyl 2-methoxypropionate, ethyl 2-methoxypropionate, methyl 2-ethoxypropionte and ethyl 2-ethoxypropionte; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in any combination thereof. These solvents are used in a sufficient amount to evenly dissolve the individual components therein.

Other components:

In order to improve the developability, storage stability and thermal-flow resistance of the positive resist composition according to the present invention, for example, a copolymer of styrene and acrylic acid, methacrylic acid or maleic anhydride, a copolymer of an alkene and maleic anhydride, a polymer of vinyl alcohol, a polymer of vinylpyrrolidone, rosin and/or shellac may be added to the positive resist composition as needed. The amount of these components to be added is 0–50 parts by weight, preferably 5–20 parts by weight per 100 parts by weight of the alkali-soluble phenol resin.

In the positive resist composition according to the present invention, may be contained one or more of compatible additives such as dyes, surfactants, storage stabilizers, sensitizers, anti-striation agents and plasticizers as needed.

Developer:

An aqueous solution of an alkali is used as a developer for the positive resist composition of the present invention. Specific examples of the alkali include inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as dimethylmethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

Proper amounts of a water-soluble organic solvent such as methanol, ethanol, propanol or ethylene glycol, a surfactant, a storage stabilizer and a dissolution inhibitor for the resin may be further added to the aqueous alkali solution as needed.

EXAMPLES

The present invention will hereinafter be described more specifically by the following Examples and Comparative Examples. Incidentally, all designations of "part" or "parts" and "%" as will be used in the following examples mean part or parts by weight and wt. % unless expressly noted.

In the following Examples and Comparative Examples, the resulting resists were evaluated in accordance with the following methods:

(1) Sensitivity:

An amount of exposure energy by which a 1:1 line and space pattern at intervals of 0.60 $\mu$m could be formed to designed dimensions was expressed in terms of exposure time (msec).

(2) Resolution:

A critical resolution (μm) under the above exposure conditions was expressed.

(3) Film loss after development:

A ratio (%) of a resist film remaining after development to the resist film before the development was expressed.

(4) Pattern profile:

A wafer on which a resist pattern had been formed was cut in a direction perpendicular to the line pattern, and the pattern was observed through an electron microscope from the sectional direction. The result thereof was ranked as "Good" where the side wall of the pattern rose at an angle of at least 80 degrees, without film loss, "Tapered" where the side wall of the pattern rose at an angle smaller than 80 degrees, "Small reduction in film thickness" where film loss of the resist pattern was observed to a small extent, or "Great reduction in film thickness" where film loss of the resist pattern was observed to a great extent.

(5) Exposure margin:

A relationship between an amount of exposure energy and dimensions of a line and space pattern at intervals 0.50 μm was diagrammed to determine a range of the exposure energy in which a variation of the pattern dimensions could be maintained within a range of from 0.475 to 0.525 μm (within ±5% of the designed dimensions). The exposure margin is a value obtained by dividing this range by sensitivity. The greater value indicates that a dimensional change with the amount of the exposure energy is smaller.

SYNTHESIS EXAMPLE 1

Synthesis of Novolak Resin A-1

A flask equipped with a condenser and a stirrer was charged with 385 g of m-cresol, 315 g of p-cresol, 360 g of 37% formalin and 2.49 g of oxalic acid dihydrate. While holding the contents at 95–100° C., a reaction was conducted for 2 hours. Thereafter, water was distilled off over 2 hours at 100–105° C., and the pressure within the flask was reduced to 10–30 mmHg while further heating the reaction mixture up to 180° C., thereby removing unreacted monomers and water. The resulting molten resin was then cooled down to room temperature to collect it, thereby obtaining 515 g of Novolak Resin (A-1). The weight average molecular weight of this novolak resin was 7,000 in terms of polystyrene by gel permeation chromatography (GPC).

SYNTHESIS EXAMPLE 2

Synthesis of Novolak Resin A-2

Added to 380 g of the novolak resin obtained in Synthesis Example 1 were 360 g of ethylcellosolve acetate to dissolve the resin. A flask was equipped with a dropping funnel, and 950 g of toluene were added dropwise to the flask from the dropping funnel in the state that the temperature of the solution in the flask was controlled to 80–85° C. The mixture was further heated at 80° C. for 1 hour. The mixture was slowly cooled to room temperature and left at rest further for 1 hour. After a supernatant of a resin deposited was removed by decantation, 570 g of ethyl lactate (ethyl 2-hydroxypropionate) were added. The resultant mixture was heated to 100° C. under 100 mmHg to remove residual toluene, thereby obtaining a solution of Novolak Resin (A-2) in ethyl lactate. The weight average molecular weight of this novolak resin was 12,100 in terms of polystyrene by GPC.

SYNTHESIS EXAMPLE 3

Synthesis of Novolak Resin A-3

A flask equipped with a condenser and a stirrer was charged with 420 g of m-cresol, 140 g of p-cresol, 158 g of 3,5-xylenol, 421 g of 37% formalin and 2.45 g of oxalic acid dihydrate. While holding the contents at 95–100° C., a reaction was conducted for 40 minutes. Thereafter, water was distilled off over 2 hours at 100–105° C., and the pressure within the flask was reduced to 10–30 mmHg while further heating the reaction mixture up to 180° C., thereby removing unreacted monomers and water. The resulting molten resin was then cooled down to room temperature to collect it, thereby obtaining 630 g of novolak resin. Added to 100 g of this novolak resin were 70 g of ethylcellosolve acetate to dissolve the resin in a 3-liter flask equipped with a dropping funnel. To the flask, 650 g of toluene were added dropwise from the dropping funnel in the state that the temperature of the solution was controlled to 80–85° C. The mixture was further heated at 80° C. for 1 hour. The mixture was slowly cooled to room temperature and left at rest further for 1 hour. After a supernatant of a resin deposited was removed by decantation, 750 g of ethyl lactate (ethyl 2-hydroxypropionate) were added. The resultant mixture was heated to 100° C. under 100 mmHg to remove residual toluene, thereby obtaining a solution of Novolak Resin (A-3) in ethyl lactate. The weight average molecular weight of this novolak resin was 5,700 in terms of polystyrene by GPC.

SYNTHESIS EXAMPLE 4

Synthesis of Photosensitive Agent B-1

A compound of the formula (b-7) was used as a polyhydroxy compound, and 1,2-naphthoquinonediazide-5-sulfonyl chloride in an amount corresponding to 70 mol % of the OH groups in the polyhydroxy compound was dissolved in dioxane to prepare a 10% solution. While controlling the temperature to 20–25° C., triethylamine in an amount corresponding to 1.2 equivalents of 1,2-naphthoquinonediazide-5-sulfonyl chloride was added dropwise over 30 minutes. The mixture was held further for 2 hours to complete a reaction. Solids deposited were collected by filtration, washed with ion-exchanged water and dried to obtain Photosensitive Agent (B-1).

SYNTHESIS EXAMPLE 5

Synthesis of Photosensitive Agents B-2 to B-8

Photosensitive Agents (B-2) to (B-8) were synthesized in accordance with the same process as in Synthesis Example 4 except that the kind of the polyhydroxy compound or the charged molar ratio of 1,2-naphthoquinonediazide-5-sulfonyl chloride to the OH groups of the polyhydroxy compound was changed. The kinds of the polyhydroxy compounds used and the charged molar ratios are shown in Table 1.

SYNTHESIS EXAMPLE 6

Synthesis of Photosensitive Agent B-9

Photosensitive Agent (B-9) was synthesized in accordance with the same process as in Synthesis Example 4 except that 2,3,4,4'-tetrahydroxybenzophenone was used as the polyhydroxy compound, and the charged molar ratio of 1,2-naphthoquinonediazide-5-sulfonyl chloride to the OH groups of this compound was changed to 85%.

SYNTHESIS EXAMPLE 7

Synthesis of Photosensitive Agent B-10

Photosensitive Agent (B-10) was synthesized in accordance with the same process as in Synthesis Example 4 except that Compound (d-1) represented by the following chemical formula was used as the polyhydroxy compound, and the charged molar ratio of 1,2-naphthoquinonediazide-5-sulfonyl chloride to the OH groups of this compound was changed to 80%.

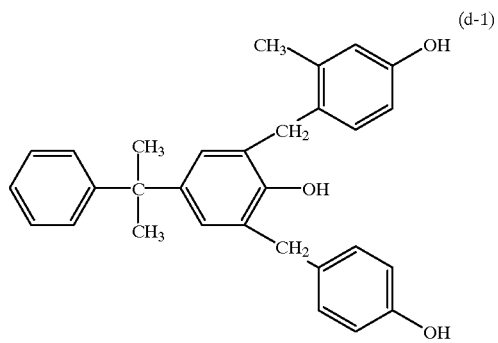

(d-1)

TABLE 1

| Photo-sensitive agent | Kind of poly-hydroxy compound | Charged molar ratio of 1,2-naphthoquinonediazide-5-sulfonyl chloride to hydroxyl groups of polyhydroxy compound (mol %) |
|---|---|---|
| B-1 | b-7 | 70 |
| B-2 | b-7 | 75 |
| B-3 | b-1 | 80 |
| B-4 | b-11 | 75 |
| B-5 | b-16 | 65 |
| B-6 | b-19 | 80 |
| B-7 | b-22 | 75 |
| B-8 | b-27 | 65 |
| B-9 | 2,3,4,4'-Tetrahydroxybenzophenone | 85 |
| B-10 | d-1 | 80 |

Examples 1–15

Their corresponding alkali-soluble phenol resins (novolak resins), photosensitive agents and aromatic compounds having a phenolic hydroxyl group (phenolic compounds) of compositions shown in Table 2 were separately dissolved in an ethyl lactate (ethyl 2-hydroxypropionate) solvent, and amounts of the solvents in the solutions were controlled in such a manner that they could be coated to a film thickness of 1.17 $\mu$m. These solutions were filtered through a polytetrafluoroethylene filter (PTFE filter) having a pore size of 0.1 $\mu$m to prepare resist solutions.

After coating a silicon wafer with each of the thus-prepared resist solutions by a spin coater, the resist solution was prebaked for 90 seconds on a hot plate heated to 90° C., thereby forming a resist film having a thickness of 1.17 $\mu$m. The silicon wafer on which the resist film had been formed was exposed with exposure time varied using a i-line stepper, "NSR-1755i7A" (manufactured by Nikon Corp., NA=0.50) and a test reticle. The thus-exposed wafer was then subjected to PEB (post-exposure baking) for 60 seconds on a hot plate heated to 110° C., followed by its development by the puddle process for 1 minute at 23° C. in a 2.38% aqueous solution of tetramethylammonium hydroxide to form a positive pattern.

The wafer on which the pattern had been formed was taken out of the aqueous solution to observe through an electron microscope, thereby evaluating it as to sensitivity, resolution and pattern profile. A film loss after development was determined by measuring the film thickness of the resist film before and after the development. These evaluation results are shown in Table 2.

Comparative Example 1

A resist solution was prepared in the same manner as in Example 1 except that the phenolic compound was not used, and the resist was evaluated under the same conditions as those in Example 1. The results are shown in Table 2.

Comparative Example 2

A resist solution was prepared in the same manner as in Example 1 except that Photosensitive Agent B-9, which was a photosensitive agent outside the scope of the present invention, was used, and the phenolic compound was not used, and the resist was evaluated under the same conditions as those in Example 1. The results are shown in Table 2.

Comparative Example 3

A resist solution was prepared in the same manner as in Example 1 except that Photosensitive Agent B-10, which was a photosensitive agent outside the scope of the present invention, was used, and the phenolic compound was not used, and the resist was evaluated under the same conditions as those in Example 1. The results are shown in Table 2.

TABLE 2

| | Composition of positive resist | | | | | | Evaluation result | | | |
|---|---|---|---|---|---|---|---|---|---|---|
| | Resin (a) | | Photosensitive agent (b) | | Phenolic compound (c) | | | Film loss after development (%) | Resolution ($\mu$m) | Pattern profile | Exposure margin |
| | Compd | Amount (part) | Compd | Amount (part) | Compd | Amount (part) | Sensitivity (msec) | | | | |
| Ex. 1 | A-1 | 95 | B-1 | 30 | C-64 | 5 | 420 | 99 | 0.38 | Good | 0.22 |
| Ex. 2 | A-2 | 80 | B-2 | 30 | C-49 | 20 | 440 | 100 | 0.36 | Good | 0.24 |
| Ex. 3 | A-2 | 80 | B-3 | 30 | C-49 | 20 | 480 | 100 | 0.38 | Good | 0.20 |
| Ex. 4 | A-2 | 80 | B-4 | 30 | C-49 | 20 | 480 | 100 | 0.36 | Good | 0.24 |
| Ex. 5 | A-2 | 80 | B-5 | 30 | C-49 | 20 | 420 | 100 | 0.36 | Good | 0.22 |
| Ex. 6 | A-2 | 80 | B-6 | 26 | C-49 | 20 | 400 | 100 | 0.38 | Good | 0.19 |
| Ex. 7 | A-2 | 80 | B-7 | 30 | C-49 | 20 | 460 | 100 | 0.36 | Good | 0.22 |
| Ex. 8 | A-2 | 80 | B-8 | 30 | C-49 | 20 | 480 | 100 | 0.38 | Good | 0.22 |
| Ex. 9 | A-2 | 80 | B-2 | 30 | C-1 | 20 | 400 | 100 | 0.36 | Good | 0.20 |

TABLE 2-continued

| | Composition of positive resist | | | | | | Evaluation result | | | |
|---|---|---|---|---|---|---|---|---|---|---|
| | Resin (a) | | Photosensitive agent (b) | | Phenolic compound (c) | | | Film loss | | | |
| | Compd | Amount (part) | Compd | Amount (part) | Compd | Amount (part) | Sensitivity (msec) | after development (%) | Resolution ($\mu$m) | Pattern profile | Exposure margin |
| Ex. 10 | A-2 | 80 | B-2 | 30 | C-13 | 20 | 440 | 100 | 0.36 | Good | 0.21 |
| Ex. 11 | A-2 | 80 | B-2 | 30 | C-52 | 20 | 380 | 100 | 0.36 | Good | 0.24 |
| Ex. 12 | A-2 | 80 | B-2 | 30 | C-56 | 20 | 400 | 100 | 0.36 | Good | 0.24 |
| Ex. 13 | A-2 | 80 | B-2 | 30 | C-60 | 20 | 420 | 100 | 0.36 | Good | 0.22 |
| Ex. 14 | A-2 | 80 | B-2 | 30 | C-12 | 10 | 400 | 100 | 0.36 | Good | 0.24 |
| | | | | | C-49 | 10 | | | | | |
| Ex. 15 | A-3 | 80 | B-1 | 30 | C-12 | 20 | 400 | 100 | 0.34 | Good | 0.23 |
| Comp. Ex. 1 | A-1 | 100 | B-1 | 30 | — | — | 460 | 99 | 0.40 | Good | 0.16 |
| Comp. Ex. 2 | A-1 | 100 | B-9 | 30 | — | — | 380 | 99 | 0.44 | Tapered | 0.10 |
| Comp. Ex. 3 | A-1 | 100 | B-10 | 30 | — | — | 520 | 100 | 0.40 | Good | 0.14 |

INDUSTRIAL APPLICABILITY

According to the present invention, there can be provided positive resist compositions which are excellent in various properties such as sensitivity, film loss after development, resolution, exposure margin and pattern profile. The positive resist compositions according to the present invention can be used as positive resists for minute processing required for the fabrication of semiconductor devices, magnetic bubble memory devices, integrated circuits and the like and are suitable for use in, particularly, minute processing to 1 $\mu$m or smaller in line width.

We claim:

1. A positive resist composition comprising in combination (a) an alkali-soluble phenol resin, (b) a photosensitive agent composed of a quinonediazide sulfonate of a polyhydroxy compound represented by the following general formula (I), and (c) an aromatic compound having at least one phenolic hydroxy group:

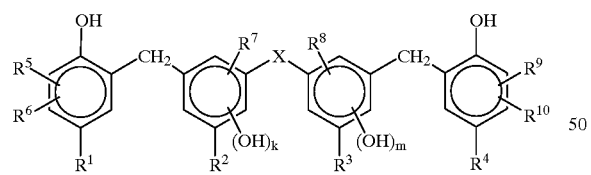

(I)

wherein k is 1 or 2;

m is 1 or 2;

$R^1$ to $R^4$ are independently a halogen atom, or an alkyl, alkenyl, alkoxy, aryl and acyl group and may be the same or different from one another;

$R^5$ to $R^{10}$ are independently a hydrogen or halogen atom, or an alkyl, alkenyl, alkoxy, aryl or acyl group and may be the same or different from one another; and X is a linking group comprising —O—, —S—, —SO—, —SO$_2$—, —CO—, —CO$_2$—, cyclopentylidene, cyclohexylidene, phenylene,

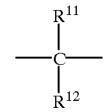

wherein $R^{11}$ and $R^{12}$ are independently a hydrogen atom, or an alkyl, alkenyl, aryl or substituted aryl group and may be the same or different from each other,

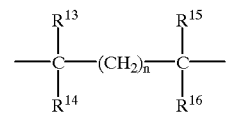

wherein $R^{13}$ to $R^{16}$ are independently a hydrogen atom or an alkyl group and may be the same or different from one another, and n is an integer of 1–5, or

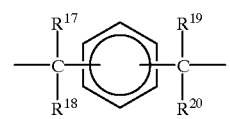

wherein $R^{17}$ to $R^{20}$ are independently a hydrogen atom or an alkyl group and may be the same or different from one another.

2. The positive resist composition according to claim 1, wherein the polyhydroxy compound represented by the general formula (I) is a compound represented by the following general formula (II):

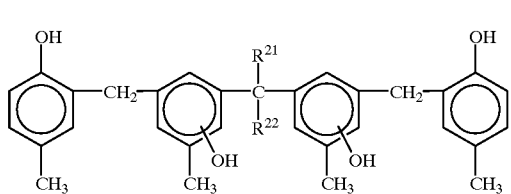
(II)

wherein $R^{21}$ and $R^{22}$ are independently a hydrogen atom or an alkyl group and may be the same or different from each other.

3. The positive resist composition according to claim 1, wherein the aromatic compound (c) having at least one phenolic hydroxyl group is an aromatic compound represented by the following general formula (III):

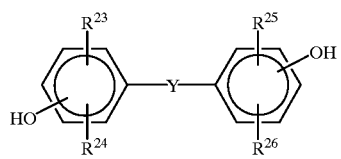
(III)

wherein $R^{23}$ to $R^{26}$ are independently a hydrogen or halogen atom, or a hydroxyl, alkyl, alkenyl, aryl or alkoxy group and may be the same or different from one another; and Y is a single bond, or a linking group comprising —O—, —S—, —SO—, —SO$_2$—, —CO—, —CO$_2$—, cyclopentylidene, cyclohexylidene, phenylene,

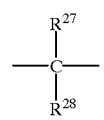

wherein $R^{27}$ and $R^{28}$ are independently a hydrogen atom, or an alkyl, alkenyl, aryl or substituted aryl group and may be the same or different from each other,

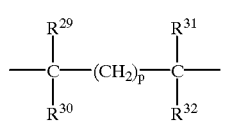

wherein $R^{29}$ to $R^{32}$ are independently a hydrogen atom or an alkyl group and may be the same or different from one another, and p is an integer of 1–5,

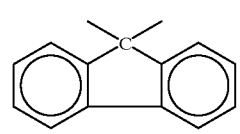

-continued

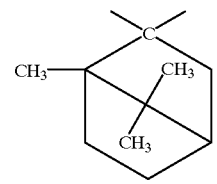

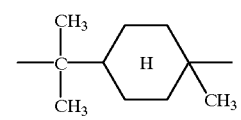

or

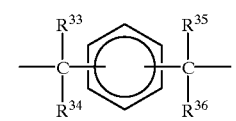

wherein $R^{33}$ to $R^{36}$ are independently a hydrogen atom or an alkyl group and may be the same or different from one another.

4. The positive resist composition according to claim 1, wherein the aromatic compound (c) having at least one phenolic hydroxyl group is an aromatic compound represented by the following general formula (IV):

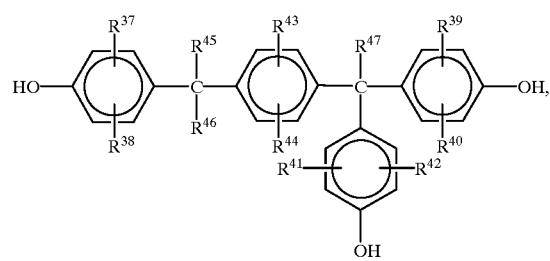
(IV)

wherein $R^{37}$ to $R^{42}$ are independently a hydrogen or halogen atom, or a hydroxyl, alkyl, alkenyl, aryl or alkoxy group and may be the same or different from each other;

$R^{43}$ and $R^{44}$ are independently a hydrogen or halogen atom, or an alkyl group and may be the same or different from each other; and $R^{45}$ to $R^{47}$ are independently a hydrogen atom or an alkyl group and may be the same or different from one another.

5. The positive resist composition according to claim 3, wherein the aromatic compound (c) represented by the general formula (III) is

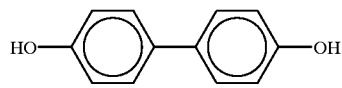

-continued

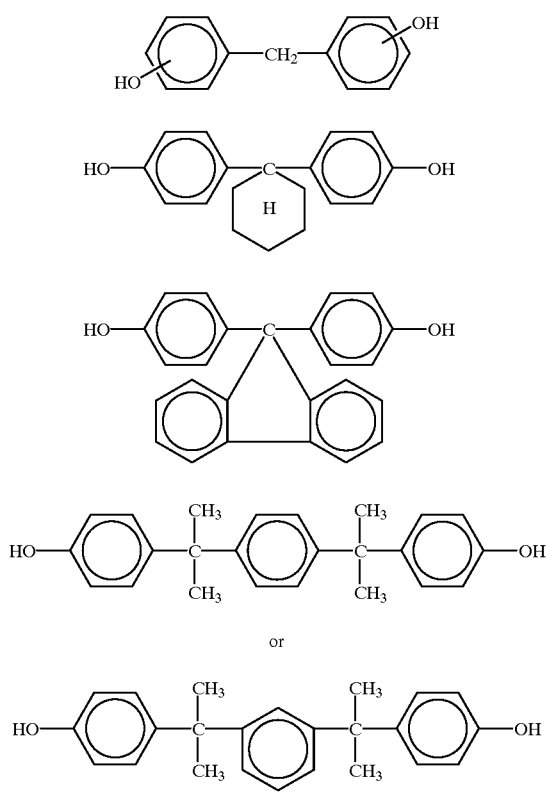

6. The positive resist composition according to claim 4, wherein the aromatic compound (c) represented by the general formula (IV) is

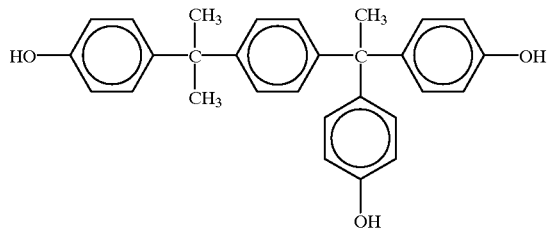

7. The positive resist composition according to claim 1, wherein the alkali-soluble phenol resin (a) is a condensation product of a phenol and an aldehyde.

8. The positive resist composition according to claim 7, wherein the phenol is a mixture of m-cresol and p-cresol.

9. The positive resist composition according to claim 7, wherein the phenol is a mixture of m-cresol, p-cresol and 3,5-xylenol.

10. The positive resist composition according to claim 1, wherein the quinonediazide sulfonate of the polyhydroxy compound represented by the general formula (I) is an ester in which the OH groups of the polyhydroxy compound have been esterified with a quinonediazide sulfonic compound to an extent of 40–95%.

11. The positive resist composition according to claim 1, wherein the composition comprises 100 parts by weight of (a) the alkali-soluble phenol resin, 1–100 parts by weight of (b) the photosensitive agent composed of the quinonediazide sulfonate of the polyhydroxy compound represented by the general formula (I) and 1–100 parts by weight of (c) the aromatic compound having at least one phenolic hydroxyl group.

12. The positive resist composition according to claim 11, wherein the composition further comprises a solvent in a sufficient amount to evenly dissolve the components (a), (b) and (c) therein.

13. The positive resist composition according to claim 1, wherein X comprises

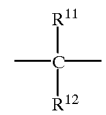

and $R^{11}$ and $R^{12}$ are independently a hydrogen atom or an alkyl group.

14. The positive resist composition according to claim 13, wherein the quinonediazide sulfonate of the polyhydroxy compound is an ester in which 40–95% of the OH groups of the polyhydroxy compound have been esterified with a quinonediazide sulfonic compound.

* * * * *

UNITED STATES PATENT AND TRADEMARK OFFICE
CERTIFICATE OF CORRECTION

PATENT NO. : 5,912,102
DATED : June 15, 1999
INVENTOR(S) : Shoji Kawata et al

It is certified that error appears in the above-indentified patent and that said Letters Patent is hereby corrected as shown below:

Claim 1, column 33, line 59, change "aryl and acyl" to --aryl or acyl--.

Claim 5, column 37, line 30, insert a period --.-- at the end of claim 5.

Claim 6, column 37, line 45, insert a period --.-- at the end of claim 6.

Signed and Sealed this

Ninth Day of November, 1999

Attest:

Attesting Officer

Q. TODD DICKINSON

Acting Commissioner of Patents and Trademarks